(12) United States Patent
Tanner

(10) Patent No.: US 7,345,407 B2
(45) Date of Patent: Mar. 18, 2008

(54) HUMAN POWERED PIEZOELECTRIC POWER GENERATING DEVICE

(75) Inventor: Edward T. Tanner, Williamsburg, VA (US)

(73) Assignee: Adaptivenergy, LLC., Hampton, VA (US)

( * ) Notice: Subject to any disclaimer, the term of this patent is extended or adjusted under 35 U.S.C. 154(b) by 0 days.

(21) Appl. No.: 11/556,315

(22) Filed: Nov. 3, 2006

(65) Prior Publication Data

US 2007/0145861 A1  Jun. 28, 2007

Related U.S. Application Data

(60) Provisional application No. 60/828,887, filed on Oct. 10, 2006, provisional application No. 60/737,809, filed on Nov. 18, 2005.

(51) Int. Cl.
*H01L 41/113* (2006.01)

(52) U.S. Cl. ..................................... 310/339

(58) Field of Classification Search ................ 310/339
See application file for complete search history.

(56) References Cited

U.S. PATENT DOCUMENTS

| | | | |
|---|---|---|---|
| 3,230,402 A | 1/1966 | Nightingale et al. | |
| 3,876,925 A | 4/1975 | Stoeckert | |
| 3,936,342 A | 2/1976 | Matsubara et al. | |
| 3,960,635 A | 6/1976 | La Roy et al. | |
| 3,967,141 A * | 6/1976 | Gawlick et al. | 310/339 |
| 4,034,780 A | 7/1977 | Horvath | |
| 4,095,615 A | 6/1978 | Ramsauer | |
| 4,773,218 A | 9/1988 | Wakita et al. | |
| 4,859,530 A | 8/1989 | Roark et al. | |
| 4,927,084 A | 5/1990 | Brandner et al. | |
| 4,939,405 A | 7/1990 | Okuyama et al. | |
| 4,952,836 A * | 8/1990 | Robertson | 310/339 |
| 5,049,421 A | 9/1991 | Kosh | |
| 5,084,345 A | 1/1992 | Manos | |
| 5,188,447 A | 2/1993 | Chiang et al. | |
| 5,271,724 A | 12/1993 | van Lintel | |
| 5,338,164 A | 8/1994 | Sutton et al. | |
| 5,471,721 A | 12/1995 | Haertling | |
| 5,512,795 A | 4/1996 | Epstein et al. | |
| 5,589,725 A | 12/1996 | Haertling | |

(Continued)

FOREIGN PATENT DOCUMENTS

EP  0 202 836 A1  11/1986

(Continued)

OTHER PUBLICATIONS

Roach,"New Backpack Generates Its Own Electricity", National Geographic News, Sep. 8, 2005, found at http://news.nationalgeographic.com/news/2005/09/0908_050908_backpack.html.

(Continued)

*Primary Examiner*—Thomas M. Dougherty
(74) *Attorney, Agent, or Firm*—Nixon & Vanderhye, P.C.

(57) ABSTRACT

An energy scavenging apparatus comprises a frame which can be human-carried or human-borne; plural cantilevered bimorph piezoelectric members connected to the frame to have an essentially parallel orientation, each cantilevered bimorph piezoelectric member comprising a proximal end connected to the frame and a distal end; and, a mass member connected to the distal end of the plural cantilevered bimorph piezoelectric members.

27 Claims, 6 Drawing Sheets

U.S. PATENT DOCUMENTS

| | | | |
|---|---|---|---|
| 5,632,841 A | 5/1997 | Hellbaum et al. | |
| 5,751,091 A | 5/1998 | Takahashi et al. | |
| 5,759,015 A | 6/1998 | Van Lintel et al. | |
| 5,811,911 A | 9/1998 | Jänker et al. | |
| 5,814,921 A | 9/1998 | Carroll | |
| 5,816,780 A | 10/1998 | Bishop et al. | |
| 5,835,996 A | 11/1998 | Hashimoto et al. | |
| 5,849,125 A | 12/1998 | Clark | |
| 5,876,187 A | 3/1999 | Afromowitz et al. | |
| 5,909,905 A | 6/1999 | Simpson | |
| 5,945,768 A | 8/1999 | Treu, Jr. | |
| 6,030,480 A | 2/2000 | Face, Jr. et al. | |
| 6,033,191 A | 3/2000 | Kamper et al. | |
| 6,042,345 A | 3/2000 | Bishop et al. | |
| 6,052,300 A | 4/2000 | Bishop et al. | |
| 6,060,811 A | 5/2000 | Fox et al. | |
| 6,071,087 A | 6/2000 | Jalink, Jr. et al. | |
| 6,071,088 A | 6/2000 | Bishop et al. | |
| 6,074,178 A | 6/2000 | Bishop et al. | |
| 6,104,127 A | 8/2000 | Kameyama et al. | |
| 6,109,889 A | 8/2000 | Zengerle et al. | |
| 6,114,797 A | 9/2000 | Bishop et al. | |
| 6,120,264 A | 9/2000 | Wang | |
| 6,124,678 A | 9/2000 | Bishop et al. | |
| 6,156,145 A | 12/2000 | Clark | |
| 6,162,313 A | 12/2000 | Bansemir et al. | |
| 6,179,584 B1 | 1/2001 | Howitz et al. | |
| 6,194,815 B1 | 2/2001 | Carroll | |
| 6,213,735 B1 | 4/2001 | Henco et al. | |
| 6,227,809 B1 | 5/2001 | Forster et al. | |
| 6,227,824 B1 | 5/2001 | Stehr | |
| 6,252,336 B1 | 6/2001 | Hall | |
| 6,257,293 B1 | 7/2001 | Face, Jr. et al. | |
| 6,379,809 B1 | 4/2002 | Simpson | |
| 6,407,484 B1 | 6/2002 | Oliver et al. | |
| 6,411,016 B1 * | 6/2002 | Umeda et al. | 310/339 |
| 6,512,323 B2 | 1/2003 | Forck et al. | |
| 6,734,603 B2 | 5/2004 | Hellbaum et al. | |
| 6,750,596 B2 * | 6/2004 | Kim et al. | 310/339 |
| 6,751,954 B2 | 6/2004 | Sewell et al. | |
| 6,761,028 B2 | 7/2004 | Takeuchi et al. | |
| 6,869,275 B2 | 3/2005 | Dante et al. | |
| 6,982,497 B2 | 1/2006 | Rome | |
| 7,034,440 B2 * | 4/2006 | Kim et al. | 310/339 |
| 7,070,674 B2 | 7/2006 | Kelley | |
| 2001/0035723 A1 | 11/2001 | Pelrine et al. | |
| 2002/0121844 A1 | 9/2002 | Ghandi et al. | |
| 2002/0195823 A1 | 12/2002 | Aguire | |
| 2003/0057618 A1 | 3/2003 | Tanner | |
| 2004/0000843 A1 | 1/2004 | East | |
| 2004/0021398 A1 | 2/2004 | East | |
| 2004/0075363 A1 | 4/2004 | Malkin et al. | |
| 2005/0120527 A1 | 6/2005 | Tanielian | |
| 2005/0206275 A1 | 9/2005 | Redzienski et al. | |
| 2005/0258715 A1 | 11/2005 | Schlabach | |
| 2005/0280334 A1 | 12/2005 | Ott et al. | |
| 2006/0087200 A1 * | 4/2006 | Sakai | 310/339 |
| 2006/0147325 A1 | 7/2006 | Vogeley | |
| 2007/0090723 A1 * | 4/2007 | Keolian et al. | 310/311 |

FOREIGN PATENT DOCUMENTS

| | | |
|---|---|---|
| GB | 2 013 311 A | 8/1979 |
| GB | 2 161 902 A | 1/1986 |
| GB | 2 250 911 A | 6/1992 |
| GB | 2 262 972 A | 7/1993 |
| JP | 5-39661 A | 2/1993 |
| WO | 87/07218 | 12/1987 |
| WO | 02/22358 A1 | 3/2002 |

OTHER PUBLICATIONS

U.S. Appl. No. 60/670,657 filed Apr. 13, 2005, entitled "Piezoelectric Diaphragm Assemblies and Methods of Making Same".

Tanner, "Combined Shock and Vibration Isolation Through the Self-Powered, Semi-Active Control of a Magnetorheological Damper in Parallel with an Air Spring", Dissertation submitted to the faculty of the Virginia Polytechnic Institute and State University, Dec. 2003.

International Search Report mailed Jan. 24, 2002 in PCT Application No. PCT/US01/28947.

GB Examination Report mailed Jun. 4, 2004 in GB application No. GB0308623.8.

GB Examination Report mailed Nov. 9, 2004 in GB application No. GB0423682.4.

International Preliminary Examination Report mailed Oct. 3, 2002 in corresponding PCT Application PCT/US01/28947.

International Search Report and Written Opinion mailed Apr. 4, 2007 in corresponding PCT application PCT/US06/43065.

* cited by examiner

HUMAN POWERED PIEZOELECTRIC POWER GENERATING DEVICE

This application claims the benefit and priority of U.S. Provisional Patent Application 60/737,809 filed Nov. 18, 2005, entitled "HUMAN POWERED PIEZOELECTRIC POWER GENERATING DEVICE", and U.S. Provisional Patent Application 60/828,887, filed Oct. 10, 2006, entitled "HUMAN POWERED PIEZOELECTRIC POWER GENERATING DEVICE", both of which are incorporated herein by reference in their entirety.

BACKGROUND

1. Field of the Invention

This invention pertains to scavenging of power by virtue of human-carried or human-borne devices.

2. Related Art and Other Considerations

It would be highly beneficial if human energy (that would otherwise be wasted) could be scavenged and stored for useful purposes, such as powering electronic devices. For example, a human walking at a normal pace of three mph produces a power output of 233 Watts. Thus, there is a considerable amount of energy that is potentially available to scavenge and use.

There has been considerable interest in the possibility of scavenging human power and either using it directly, or storing it for later use, to power electronic devices. While the interest in the feasibility of this concept was initially generated by the military to power an assortment of electronic equipment carried by a soldier in the field, recent interest in powering portable, personal electronic devices, such as cell phones and MP3 players, is beginning to see interest. See, for example, U.S. Patent Publication 2001/0035723 wherein electroactive polymer devices are used to generate electrical energy by converting mechanical energy generated during by heel strikes during walking into electrical energy.

To date, the problems with scavenging human energy have been summed up in several reports issued by the U.S. United States Office of Naval Research (ONR) and the United States Defense Advanced Research Projects Agency (DARPA) Defense Sciences Office (DSO). Thus far, ONR and DARPA DSO have found such devices to date to have one or more of low power output, to be overly complex and/or bulky, and not to be cost effective.

As an example, FIG. 1 shows a previously suggested device for scavenging human power through the up-and-down motion of the contents in a backpack. The modified backpack of FIG. 1 consists of a series of springs that allow the contents of the backpack to bounce up and down during walking. The bouncing cargo of the FIG. 1 backpack is directly coupled to a linear gear which in turn drives a small, conventional rotary generator. It is claimed that the FIG. 1 backpack can produce up to 7 Watts of power from the up-and-down motion of the contents of an 85 lb pack during normal walking. The FIG. 1 backpack concept device is described, e.g., at http:/news.nationalgeographic.com/news/2005/09/0908_050908_backpack.html. See also U.S. Patent Publication 20040183306 and U.S. patent application Ser. No. 10/803112, filed Mar. 17, 2004.

Several problems with the FIG. 1 type of scavenging device are evident. The first is that the scavenging equipment is fairly complex. It also adds 10 lbs to the weight of the backpack, which is obviously undesirable as this directly translates into a decreased load carrying capacity. This is certainly an important issue in military applications. Another issue is that the up-and-down motion of the pack contents could lead to fatigue of the carrier, or even loss of balance. Again this is an important issue, particularly in military applications.

Piezoceramic devices have also been suggested to scavenge footfall energy, energy available from limb motion, and respiratory energy. However, a problem arises with using piezoceramic devices to scavenge energy—fragility of the ceramic itself.

What is needed, therefore, and an object of the present invention, is a human-carried piezogenerator device which is sufficiently rugged to scavenge energy.

BRIEF SUMMARY

An energy scavenging apparatus comprises a frame which can be human-carried or human-borne; plural cantilevered bimorph piezoelectric members connected to the frame to have an essentially parallel orientation, each cantilevered bimorph piezoelectric member comprising a proximal end connected to the frame and a distal end; and, a mass member connected to the distal end of the plural cantilevered bimorph piezoelectric members.

Preferably each of the cantilevered bimorph piezoelectric members are ruggedized laminated piezoelectric devices.

In an example embodiment, the mass member is commonly connected to each of the plural cantilevered bimorph piezoelectric members. As an example implementation of this embodiment, the plural cantilevered bimorph piezoelectric members are connected to opposing sides of the frame in rib fashion, and the distal end of each of the plural cantilevered bimorph piezoelectric members is connected to a sternum-situated central mass member. The central mass member is free-floating except for its suspension attachment to the distal ends of the cantilevered bimorph piezoelectric members. Preferably the central mass member has a mass chosen so that the resonant frequency of the apparatus is be tuned to footfall cadence.

In another example embodiment, each of the plural cantilevered bimorph piezoelectric members has a distinct mass member connected to its distal end. The plural cantilevered bimorph piezoelectric members are connected to opposed sides of the frame in an interleaved fashion. Preferably the mass member of each of the plural cantilevered bimorph piezoelectric members has a mass chosen to tune each of the plural cantilevered bimorph piezoelectric members to a desired resonant frequency to achieve a desired deflection of the distal end of the cantilevered bimorph piezoelectric member.

In another example embodiment, an energy scavenging apparatus comprises a frame which can be human-carried or human-borne; plural piezoelectric members connected to the frame in a manner to cause vibration of the piezoelectric members as a result of human footfall and to generate output power; and, an amplifier for amplifying the vibration of the piezoelectric members.

In the embodiment which comprises an amplifier, as one example, non-limiting implementation the amplifier can comprise nesting frame structures. In such nesting frame structure embodiment, the frame is a bouncing body frame which is resiliently mounted to an outer frame. The bouncing body frame comprises two opposed members to which the plural cantilevered bimorph piezoelectric members are connected. Each of the two opposed members has a guide channel formed therein, with each guide channel being configured to slidably accommodate a guide rod connected to the outer frame. A resilient member is positioned about each guide rod between the bouncing body frame and the outer frame. In one variation of this the nested frame embodiment, the mass member is commonly connected to each of the plural cantilevered bimorph piezoelectric members. In another variation of the nested frame embodiment, each of the plural cantilevered bimorph piezoelectric members has a distinct mass member connected to its distal end. In such variation the plural cantilevered bimorph piezoelectric members can be connected to opposed sides of the frame in an interleaved fashion.

In some example embodiments, the frame is configured to be carried or borne in a manner to excite plural vibrational modes of the plural cantilevered bimorph piezoelectric members, and thereby provide amplification of power provided by the piezoelectric members.

In another example embodiment, at least one of the plural cantilevered bimorph piezoelectric members comprises a non-uniform piezoelectric profile along its length. For example, at least one of the plural cantilevered bimorph piezoelectric member can be piezoelectrically inactive in a region near its proximal end and piezoelectrically active in region near its distal end. As another example, at least one of the plural cantilevered bimorph piezoelectric member can be piezoelectrically active in a region near its proximal end and piezoelectrically active in region near its distal end, but piezoelectrically inactive in a mid-section region between the region near its proximal end and the region near its distal end. As yet another example, at least one of the plural cantilevered bimorph piezoelectric members can comprise a constant stress profile along its length (e.g., be tapered along at least one of its dimensions).

Another example embodiment of an energy scavenging apparatus comprises a housing for defining a chamber; two resilient assemblies positioned proximate respective two ends of the chamber; and, a mass member situated for reciprocating motion in the chamber between the two resilient assemblies. Each of the two resilient assemblies comprises a piezoelectric member which, when deflected by the mass member, produces a voltage and which replies to the reciprocation with a spring force to facilitate further reciprocation. For example, each of the two resilient assemblies can comprise a pair of curved piezoelectric members, with each of the piezoelectric members comprising a concave surface and a convex surface. The two piezoelectric members having their concave surface oriented toward one another and peripheries of their concave surface substantially contacting one another. A convex surface of a first of the piezoelectric members of the pair is oriented toward the mass member and a convex surface of a second of the piezoelectric members of the pair is oriented toward an end of the chamber.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Figure 2:
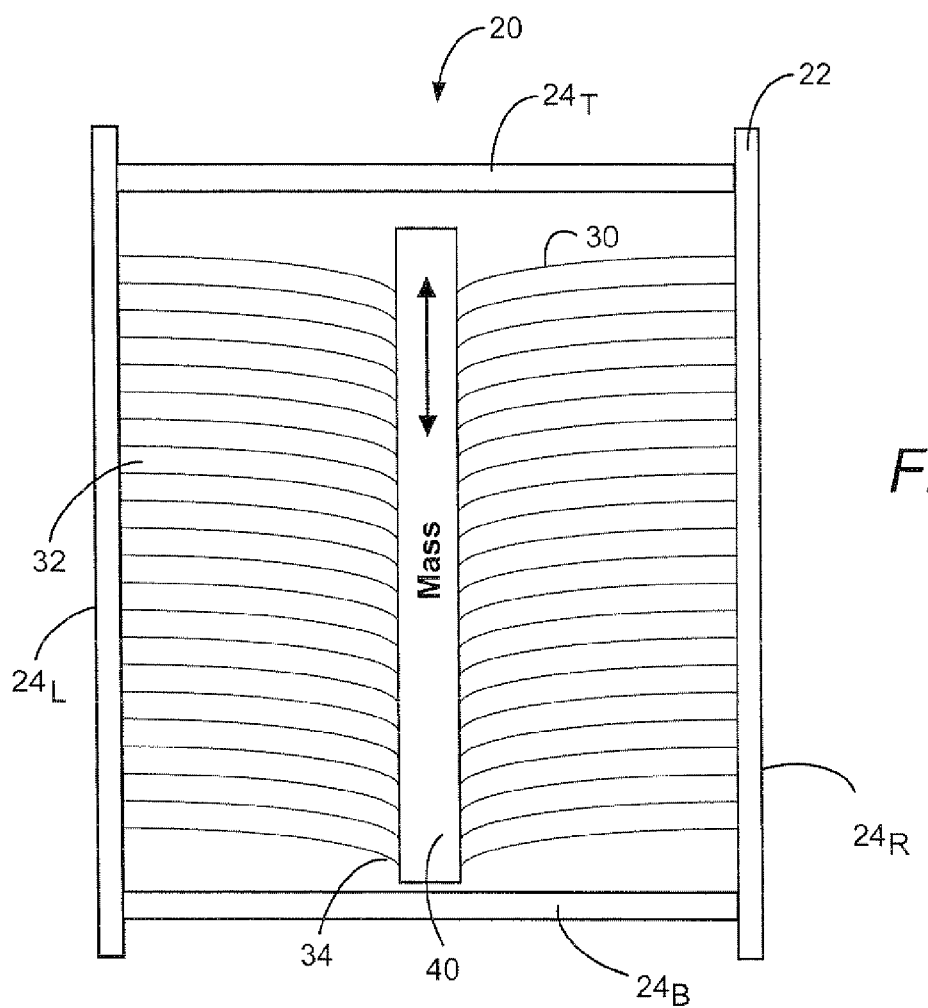
FIG. 2 is a diagrammatic view of an example embodiment of a piezoelectric energy scavenging device.

FIG. 2 shows an example embodiment of an energy scavenging device 20 which produces a high power output (relative to comparable devices), and which is both simple and inexpensive. The energy scavenging device 20 comprises a frame 22. The frame 22 can be inserted or otherwise attached to a human-carried or human-borne item, such as a backpack. Alternatively, the frame 22 can serve as a portion of a frame or skeletal structure for such a human-carried or human-borne item.

In the example embodiment of FIG. 2, frame 22 happens to have an essentially rectangular shape with two opposing horizontal members $24_T$ and $24_B$, as well as two opposing vertical members $24_R$ and $24_L$. The opposing members are illustrated as being parallel, although non-parallel configurations are also possible. The energy scavenging device 20 comprises plural cantilevered bimorph piezoelectric members 30 arranged in rib fashion, each cantilevered bimorph piezoelectric member 30 comprising a frame end 32 connected to one of the opposing vertical members $24_R$ and $24_L$ and a distal end 34 connected to a sternum-situated central mass member 40. The central mass member 40 is free-floating except for its suspension attachment to the distal ends 34 of the cantilevered bimorph piezoelectric members 30. The central mass member 40 allows the resonant frequency of the system to be tuned to footfall cadence which would allow for the most efficient energy production.

Preferably each of the cantilevered bimorph piezoelectric members 30 are ruggedized laminated piezoelectric devices such as those described in one or more of the following (all of which are incorporated herein by reference in their entirety): PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380, 589, filed Mar. 17, 2003; and U.S. Provisional Patent Application, filed Apr. 13, 2005, entitled PIEZOELECTRIC DIAPHRAGM ASSEMBLIES AND METHODS OF MAKING SAME. The ruggedized laminated piezoelectric device has an ability to displace by a larger magnitude than an ordinary piezoceramic, and achieves higher strain rates, without damage. These capabilities allow the ruggedized laminated piezoelectric device to output far greater average power than other piezoelectric devices. In fact, simulations show that an ruggedized laminated piezoelectric device has the potential to output ten times as much power as other similar devices.

In one example implementation, each cantilevered bimorph piezoelectric member 30 of the energy scavenging device 20 of FIG. 2 has a length (L) of eight inches and a width (W) of 0.75 inches, and a 10% electromechanical conversion efficiency. As such, each cantilevered bimorph piezoelectric member 30 can output 3 Watts average power with a one Hertz input. The total allowable vertical deflection is 3.0" P-P. In the example implementation, each cantilevered bimorph piezoelectric member 30 thus has a length to allowable deflection ratio of :3, and an inch deflection to Watts average power ratio (at one Hertz input) of 1:1.

As thusly described, the technology provides an energy scavenging device comprises a frame which can be inserted or otherwise attached to a human-carried or human-borne item, such as a backpack. Alternatively, the frame can serve as a portion of a frame or skeletal structure for such a human-carried or human-borne item. Plural cantilevered bimorph piezoelectric members are arranged in rib fashion, each cantilevered bimorph piezoelectric member comprising a frame end connected to the frame and a distal end connected to a sternum-situated central mass member. The central mass member is free-floating except for its suspension attachment to the distal ends of the cantilevered bimorph piezoelectric members. The central mass member allows the resonant frequency of the system to be tuned to footfall cadence which would allow for the most efficient energy production. Preferably each of the cantilevered bimorph piezoelectric members are ruggedized laminated piezoelectric devices. The energy scavenging device produces a high power output (relative to comparable devices), and is both simple and inexpensive.

Figure 3:
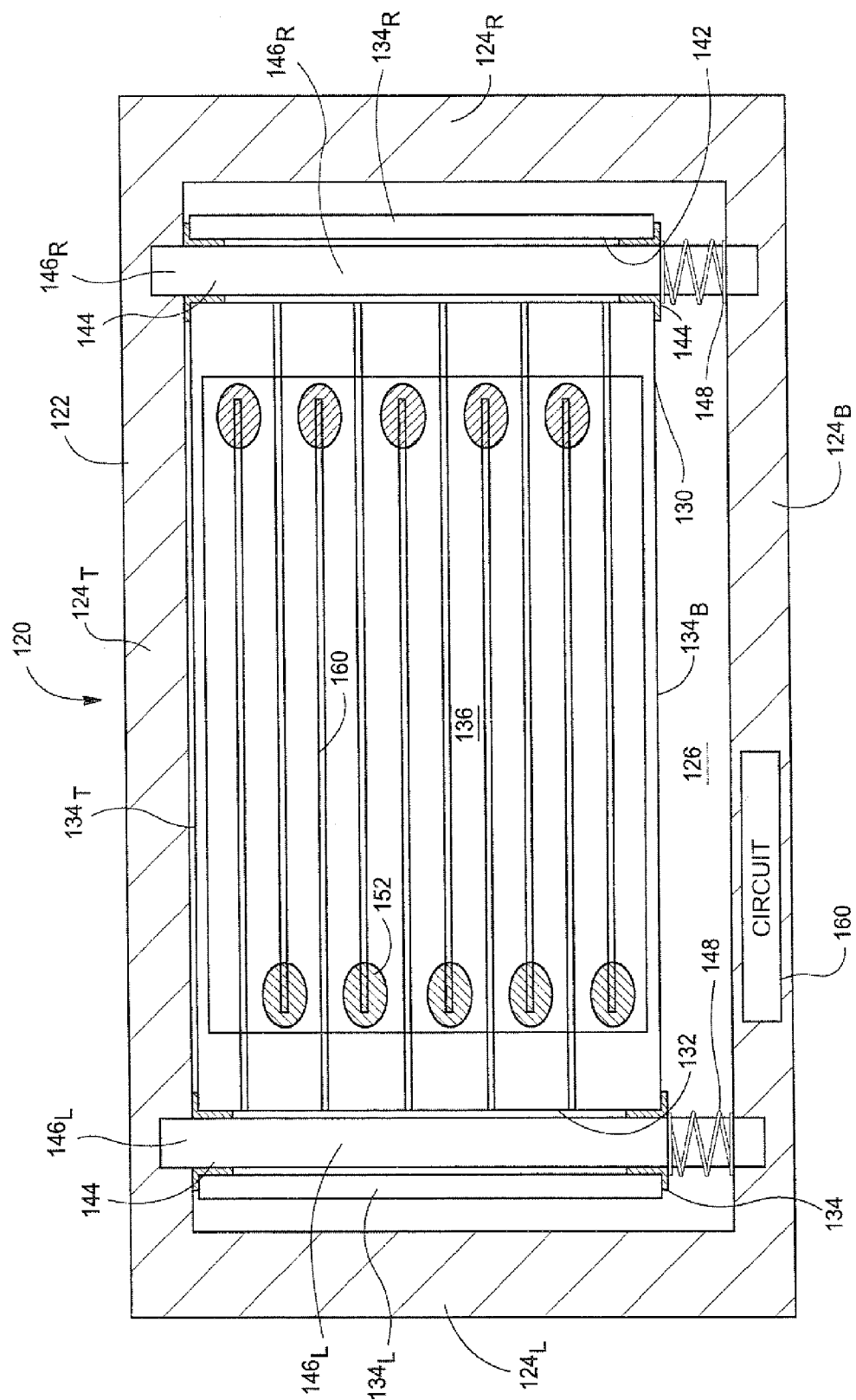
FIG. 3 is a diagrammatic view of another example embodiment of a piezoelectric energy scavenging device.

FIG. 3 shows an another example embodiment of a high power output, light, and inexpensive energy scavenging device. The energy scavenging apparatus of FIG. 3 comprises a frame which can be human-carried or human-borne; plural piezoelectric members connected to the frame in a manner to cause vibration of the piezoelectric members as a result of human footfall and to generate output power; and, an amplifier for amplifying the vibration of the piezoelectric members.

The amplifier structure of an energy scavenging device can take various forms. In the particular implementation of energy scavenging device 120 of FIG. 3, the amplifier structure comprises nested frames, with one frame (a bouncing body frame) resiliently biased with respect to the other frame (an outer frame) for promoting excitation of plural vibratory modes of the piezoelectric members. The amplifier structure can be realized in different ways in other embodiments.

Thus, the energy scavenging device 120 of FIG. 3 comprises an outer frame 122. In one example implementation, outer frame 122 comprises two opposing horizontal members $124_T$ and $124_B$, as well as two opposing vertical members $124_R$ and $124_L$. The horizontal members $124_T$ and $124_B$ and vertical members $124_R$ and $124_L$ are oriented to bound or define a cavity or interior space 126.

The opposing members are illustrated as being parallel, although non-parallel configurations are also possible. The horizontal members $124_T$ and $124_B$ and vertical members $124_R$ and $124_L$ can comprise the outer frame as a type of housing for substantially completely enclosing interior space 126 and components (as subsequently described) therein, the interior region (and thus components therein) can be unbounded in other dimensions so that the frame 122 has an open face and rear face surface in the manner shown in FIG. 3.

As previously indicated, the outer frame 122 defines interior space 126. A sliding or bouncing body 130 is situated an interior space 126. The bouncing body 130 itself has a frame (known as the bouncing body frame) which comprises opposing horizontal members $134_T$ and $134_B$ and two opposing vertical members $134_R$ and $134_L$, which similarly define an interior space 136.

An apertures or guide channel 142 extends entirely through bouncing body 130, and in particularly through opposing vertical members $134_R$ and $134_L$ from top to bottom. The guide channels 142 are slightly spaced away from the vertical sidewalls of bouncing body 130. Each end of both guide channel 142 is fitted with a hollow frictionless bushing 144 or the like. A guide rod 146 extends essentially frictionlessly through each the pair of bushings 144 for each guide channel 142, i.e., guide rod 146L extends through the left guide channel and guide rod 146R extends through the right guide channel. Each guide rod 146 has its top end anchored in members $134_T$ and its bottom end anchored in member $134_B$. A spring 148 or other resilient member is coiled around bottom ends of each guide rod 146 or is otherwise placed or captured between the member $134_B$ and the lower bushing 144 of bouncing body 130.

The energy scavenging device 120 comprises plural cantilevered bimorph piezoelectric members 150 which extend into sliding body interior space 136. The cantilevered piezoelectric members 150 each have a proximal end anchored into one of the two opposing vertical members $134_R$ and $134_L$. In the example embodiment of FIG. 3, the cantilevered piezoelectric members 150 are alternately anchored in opposing vertical members $134_R$ and $134_L$ from top to bottom of sliding body interior space 136. In other words, a cantilevered piezoelectric member 150 anchored in vertical member $134_R$ has its distal end extending (in the vertical direction) between two cantilevered piezoelectric members 150 which are anchored in vertical member $134_L$, and vise versa.

In an example implementation, each piezoelectric member 150 carries a weighting mass 152 at its distal end. The size and weight of the weighting mass 152 is selected or chosen in accordance with various criteria, such as tuning the piezoelectric members to a desired resonant frequency thus ensuring maximum achievable deflection at the end of the piezoelectric member in relation to a given input excitation. In a variation, the individual piezogenerator members could be tuned to different frequencies to scavenge the most energy from an input that contains multiple frequencies. In other words, the piezogenerator members can be tuned to obtain production of the maximum power output from the device. In one example implementation, the weighting mass 152 is configured as being of spherical shape for sake of illustration, but other geometric shapes are also feasible (e.g., elliptical, rectangular).

Each piezoelectric members 150 has electrodes of its piezoelectric member connected (by unillustrated electrical leads) to an energy collection circuit 160. The energy collection circuit 160 can be carried by or situated on frame 122 or can be remote from frame 122 (e.g., carried elsewhere on a human body or incorporated into an electronic device which is powered by energy scavenging device 120).

In operation, the bouncing body 130 of energy scavenging device 120 slides on guide rods 146, impacting the interior upper and interior bottom surfaces of horizontal members $124_T$ and $124_B$, respectively, during both upward and downward motion. The bouncing arrangement of bouncing body 130 with respect to frame 122 serves as an amplifier for amplifying the vibration and thus the output power of piezoelectric members, e.g., for causing vibration of the piezoelectric members in many modes.

Figure 4:
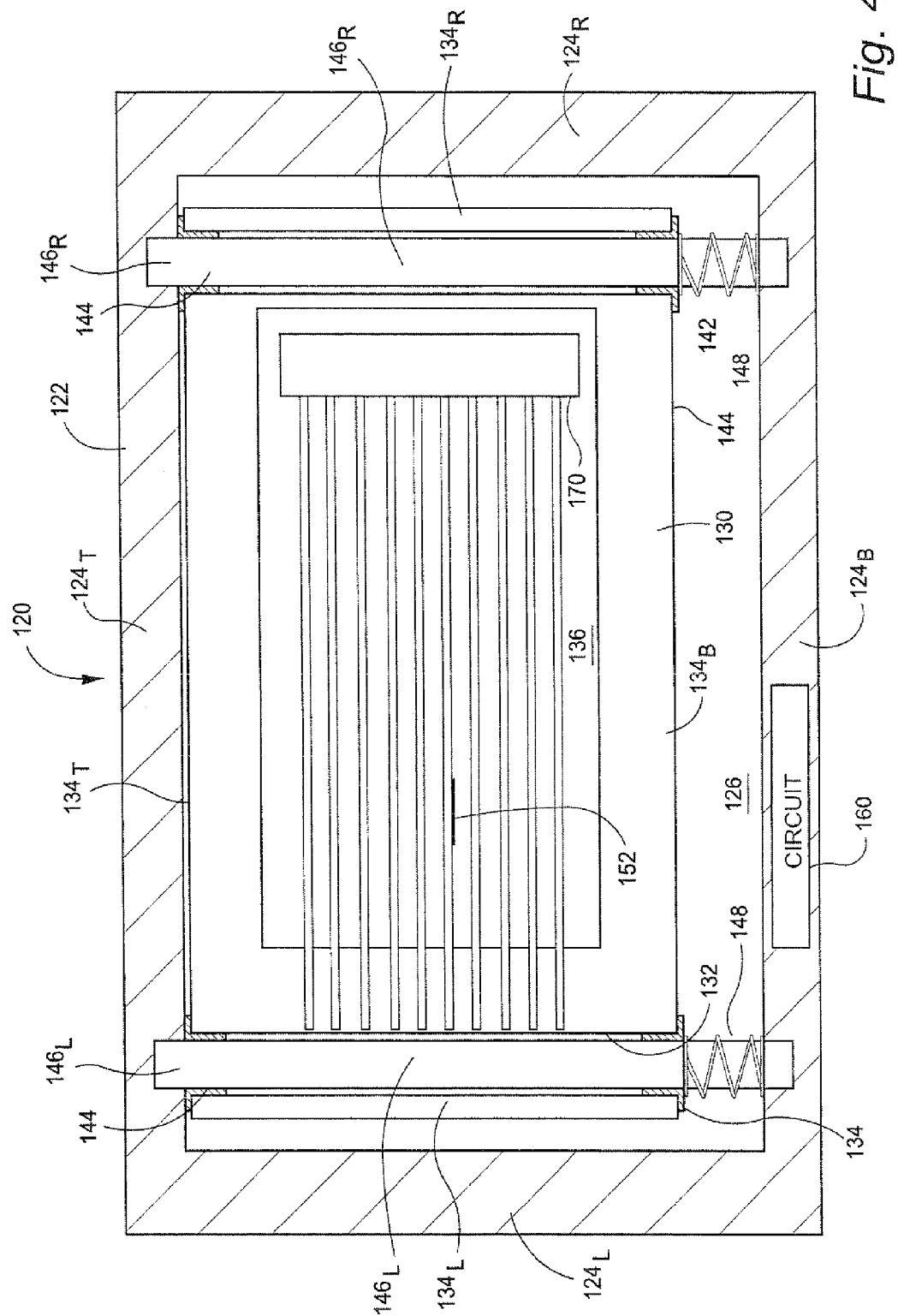
FIG. 4 is a diagrammatic view of another example embodiment of a piezoelectric energy scavenging device.

FIG. 4 shows an another example embodiment of a high power output, light, and inexpensive energy scavenging device 220. The energy scavenging device 220 of FIG. 4 resembles the energy scavenging device 120 of FIG. 3, and in view of the similarities has comparably numbered components. One difference is that the energy scavenging device 220 of FIG. 4 has all its piezoelectric members 150 anchored into a same vertical member $134_L$ rather than in both vertical members. The anchoring vertical member for all piezoelectric members 150 could alternately be vertical member $134_R$. As another difference, facilitated by the anchoring scheme of FIG. 4, at least some of the distal ends of piezoelectric members 150 of energy scavenging device 220 share the same weighting mass. In the illustrated example implementation, all distal ends of piezoelectric members 150 of energy scavenging device 220 share a common monolithic weighing mass 170. It will be appreciate that plural weighing masses can instead be employed.

A conventional energy scavenging device, when worn or carried by a human, may have to operate at a frequency of about 1 Hz. Power output of a energy scavenging device is related to frequency. In some instances a greater power output than that provided by a 1 Hz input may be desired. The energy scavenging devices 120 and 220 of the embodiments of FIG. 3 and FIG. 4 provide a greater or amplified power output by exciting all vibrational modes of the piezoelectric members 150 simultaneously. In the energy scavenging devices 120 and 220, upon an impact such as that of a human step, the bouncing body 130, in the form of a cage, slides on guide rods 146. The bouncing body 130 is supported by springs 148, which allow the bouncing body 130 to rebound as bouncing body 130 hits the bottom of frame 122. As bouncing body 130 impacts both the bottom horizontal frame member $124_B$ and the top horizontal frame member $124_T$, all vibration modes of the piezoelectric members 150 are excited.

The bouncing body 130 of the energy scavenging devices 120 and 220 can be set to bounce at a higher frequency that the typical 1 Hz frequency gait of a human. The higher frequency of bouncing body 130 with its multi-mode vibrating piezoelectric members 150 results in generation of more voltage and current by piezoelectric members 150, and thus a higher power output from energy collection circuit 160.

The frequency of the bouncing body 130 can be set by adjusting or setting such parameters as the spring constant of springs 148 and the mass of the bouncing body 130, but in general the springs should be just stiff enough that the bouncing body is allowed to move back and forth thus impacting both of the horizontal frame members $124_B$ and $124_T$ with the given input excitation.

Preferably each of the cantilevered bimorph piezoelectric members 30 are ruggedized laminated piezoelectric devices such as those described in one or more of the following (all of which are incorporated herein by reference in their entirety): PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003; and U.S. Provisional Patent Application, filed Apr. 13, 2005, entitled PIEZOELECTRIC DIAPHRAGM ASSEMBLIES AND METHODS OF MAKING SAME. The ruggedized laminated piezoelectric device has an ability to displace by a larger magnitude than an ordinary piezoceramic, and achieves higher strain rates, without damage. These capabilities allow the ruggedized laminated piezoelectric device to output far greater average power than other piezoelectric devices. In fact, simulations show that an ruggedized laminated piezoelectric device has the potential to output ten times as much power as other similar devices.

While the preceding discussion has assumed for illustration a bimorph cantilever, other piezoelectric packages such as disks, unimorphs of various geometries, etc., could be utilized as well with the same advantages for a ruggedized laminated piezoelectric device.

Figure 5:
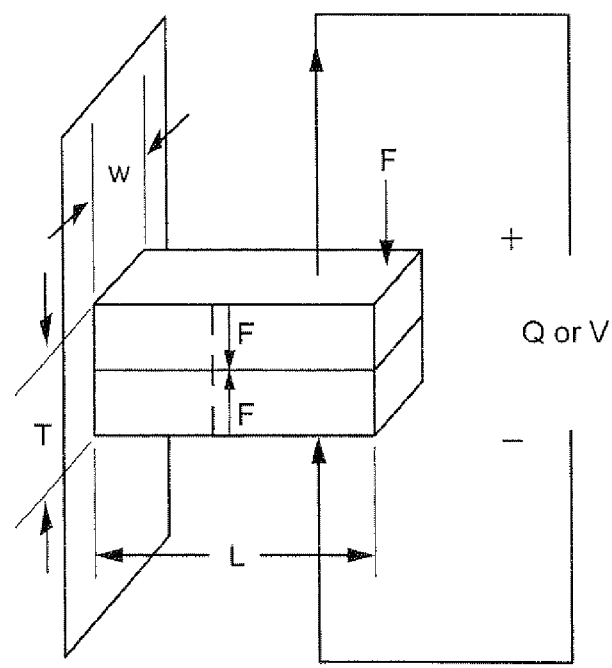
FIG. 5 is a schematic view of generic bimorph cantilevered piezogenerator, illustrating, e.g., various parameters of the piezogenerator.

One reason for the increased power output of the ruggedized laminated piezoelectric device becomes clear by investigating the equations describing the power output of a typical scavenging device. FIG. 5 illustrates various parameters of a generic bimorph cantilevered piezogenerator that can be used to scavenge vibrational energy. Equations 1-4 describe the power output from a generic bimorph cantilevered piezogenerator that can be used to scavenge vibrational energy.

$$P = V \cdot i \qquad \text{Equation 1}$$

$$V = \frac{3FL}{2WT} g_{31} \qquad \text{Equation 2}$$

$$i = \frac{dQ}{dt} = \frac{3FL^2}{2T^2} d_{31} \qquad \text{Equation 3}$$

$$P = \frac{9}{64} \frac{E^2 WT^2}{L^2} d_{31} g_{31} x \dot{x} \qquad \text{Equation 4}$$

In particular, Equation 4 describes the average power output from the device. From Equation 4 it is clear that there are three distinct groups of parameters that affect the power output. A first group of parameters are the geometric properties such as the length (L), width (W), and thickness (T) of the device. These geometric properties are constrained by the allowable dimensions of the device in a particular application. A second group of parameters are the piezoelectric properties of the piezoceramic (e.g., $d_{31}$ and $g_{31}$), which are constrained by the choice of piezoceramic. A third group of parameters relates to the loading of the device itself ($x\dot{x}$). From Equation 4, power output of the device is proportional to the product of the displacement and velocity of the device. Therefore, if the device can undergo larger displacements and higher velocities (strain rates) without damage, then the device can output far greater power. The ruggedized laminated piezoelectric device is able to undergo larger displacements and higher velocities (strain rates) without damage, and therefore can generate greater power than a usual piezoceramic device.

Figure 1:
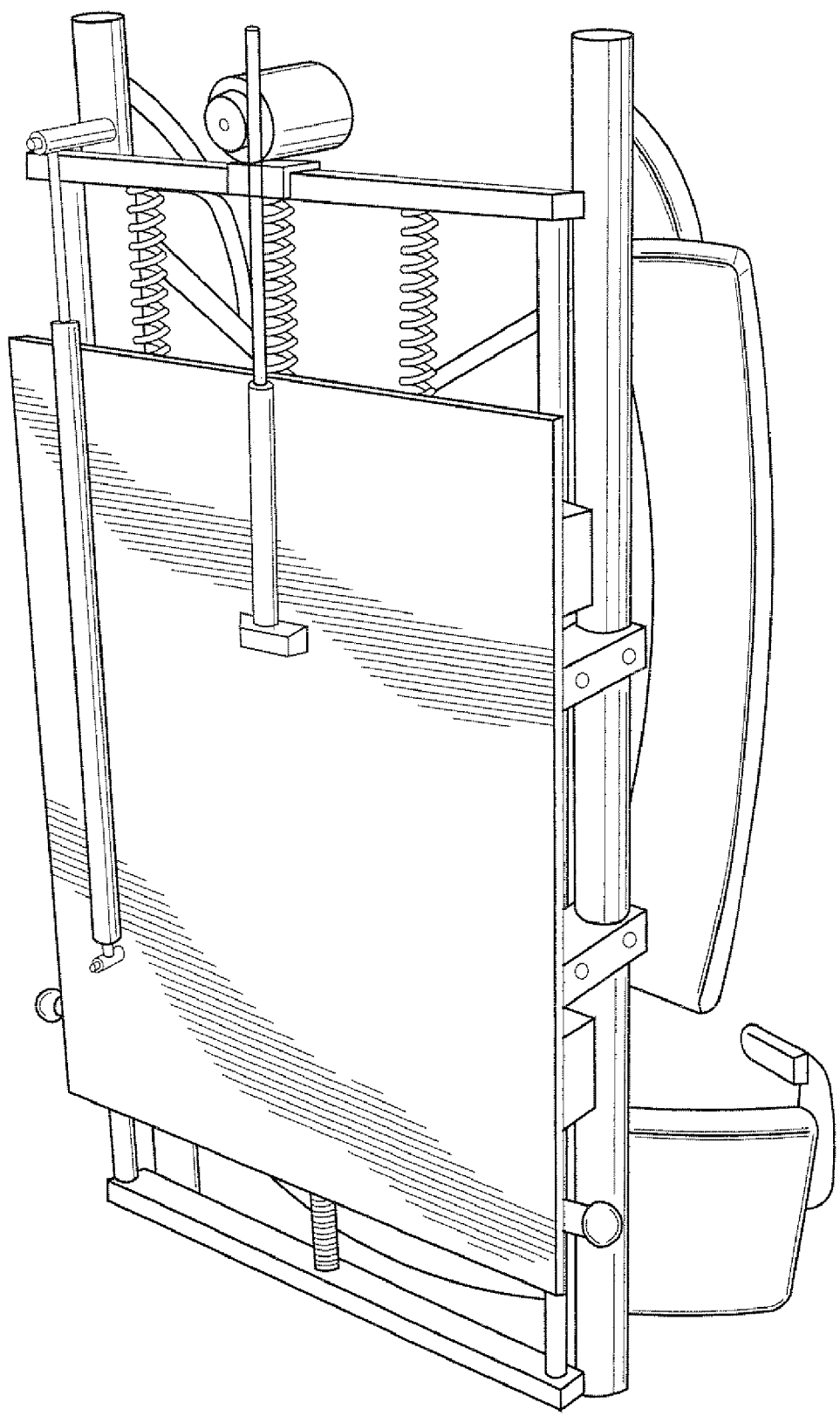
FIG. 1 is a diagrammatic view of a previously suggested device for scavenging human power through the up-and-down motion of the contents in a backpack.

Thus, a major advantage of the energy scavenging devices described herein, particularly a energy scavenging device utilizing the ruggedized laminated piezoelectric devices, is increased power output. For the embodiment of FIG. 2, for example, simulations show a power output of 3 Watts for each of the cantilevered bimorph piezoelectric members 30. The power output from each device could be summed to produce a sizable total power output. Also the system is much simpler than the one shown in FIG. 1 and is very light in weight. Furthermore, since the device does not rely on the motion of the pack contents to produce energy it would not have a tendency to fatigue the wearer, or cause him/her to lose their balance.

One example application described above is a backpack application, in which frame 22, frame 122, or frame 222 either forms part of a backpack frame or is carried by a backpack (e.g., internally in the backpack or a pocket or compartment of the backpack). The backpack implementation is especially beneficial for military purposes as it allows the energy available from a walking soldier to be scavenged and stored to power the many electronic devices carried by the modern soldier. Besides the backpack application, there are several other potential uses of this technology for scavenging human power. Examples are ruggedized laminated piezoelectric devices placed in shoes or boots to scavenge footfall energy, resonant devices, such as a tuned cantilever, attached (e.g., clip on) to the leg, or arm, or belt, to scavenge energy from limb motion and/or footfall impact, resonant devices built into the heels of shoes or boots, hydraulically driven ruggedized laminated piezoelectric device stacks in shoes or boots, to name a few. The energy scavenging devices can be packaged in a self-contained unit that could be strapped onto a leg, or arm, or belt, of the wearer to scavenge energy from human motion. The energy collection circuits can be carried by the energy scavenging devices themselves, or incorporated into other electronic devices that utilize the energy harvested by the energy scavenging devices.

As mentioned above the backpack device and the footfall devices would be very useful to the military. The strap-on device could conceivably be used to power, or significantly extend the battery life of, personal portable electronic devices such as cell phones or MP3 players.

The cantilever piezoelectric members described in the preceding embodiments can take various forms. For example, the cantilever piezoelectric members need not be piezoelectrically active throughout their entire length. That is, the cantilever piezoelectric members can have a non-uniform piezoelectric profile along their length. Moreover, the non-uniform piezoelectric profile of a piezoelectric member such as a cantilever piezoelectric member as described herein pertains to apparatus including and beyond the human-borne or human-carried embodiments herein described, and is not limited to the human-borne or human-carried embodiments.

Figure 6:
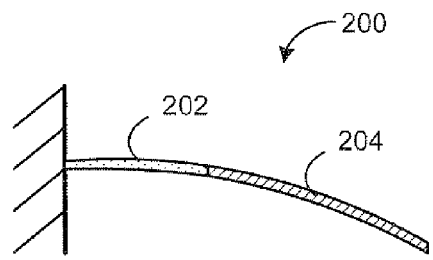
FIG. 6 is a schematic side view of an example embodiment of a cantilever piezoelectric member which is piezoelectrically active in a region near its proximal end but piezoelectrically inactive in a region near its distal end.

In the above regard, FIG. 6 illustrates an example embodiment of a cantilever piezoelectric member 200 which is piezoelectrically active in a region 202 near its proximal end, but piezoelectrically inactive in a region 204 near its distal end. In the illustrated implementation, a weighted mass 206 is connected to the distal end of cantilever piezoelectric member 200.

Figure 7:
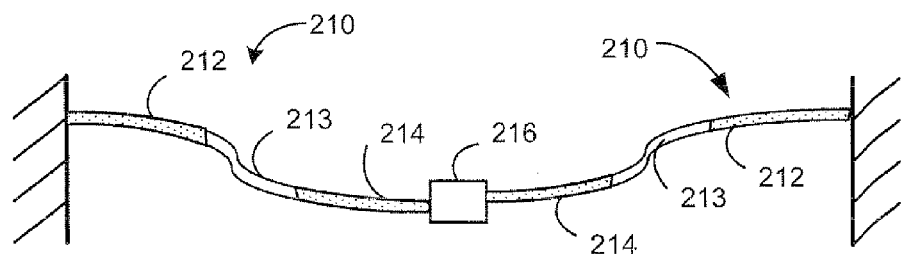
FIG. 7 is a schematic side view of an example embodiment of two connected cantilever piezoelectric members which are piezoelectrically active in regions near their proximal ends but piezoelectrically inactive in regions near their distal ends.

FIG. 7 is a schematic side view of an example embodiment of two connected cantilever piezoelectric members 210 which are piezoelectrically active in regions 212 near their proximal ends, are piezoelectrically inactive in mid-section regions 213, and are piezoelectrically active in regions 214 near their distal ends. The distal ends of the two connected cantilever piezoelectric members 210 are connected by weighted mass 216. Collectively, the two connected cantilever piezoelectric members 210 of FIG. 7 acquire an "S" shape. Each piezoelectrically active portion of the piezoelectric members 210 is connected by unillustrated electrical leads to the energy collection circuit 160.

Mounting arrangements such as those shown in FIG. 6 and FIG. 7 produce strain in a greater portion of the piezoceramic material thus producing a greater power output than a device with a single fixed end. The strain would be higher near the ends of the piezoelectric elements. The piezoelectric members could have piezoceramic along the entire length of the device. More power would be generated by the piezoceramic in the areas of higher strain.

The majority of the stress in a simple cantilever beam is concentrated in an area that is very close to the fixed end. However, a beam can be designed, e.g., profiled, such that the stress is constant along the length of a beam. This can be accomplished by tapering the beam either along its length, or through its thickness, or both.

Thus, constant stress beams (also known as constant stress profiled beams) can be utilized as another means for increasing power output. The majority of the stress in a simple cantilever in concentrated near the fixed end (bend line). Thus little of the piezoceramic is actually producing power.

Figure 8A:
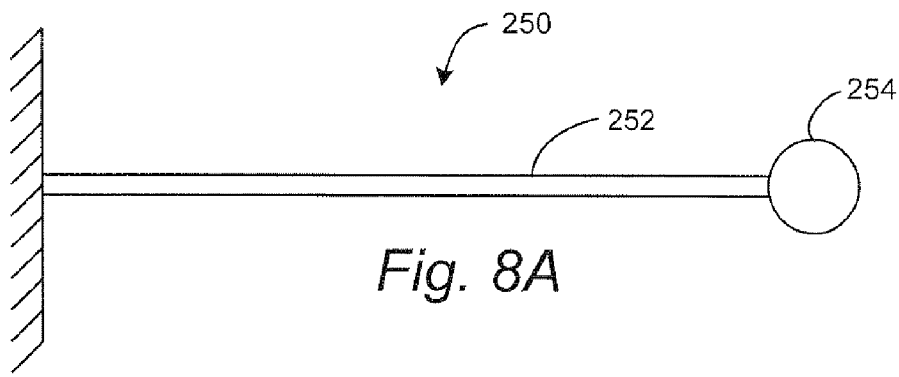
FIG. 8A and FIG. 8B are top views of example embodiments of constant stress tapered cantilever piezoelectric beams.
Figure 8B:
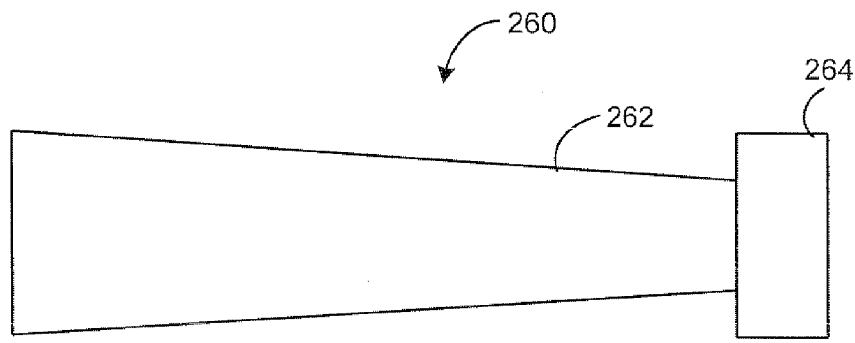
Figure 9A:
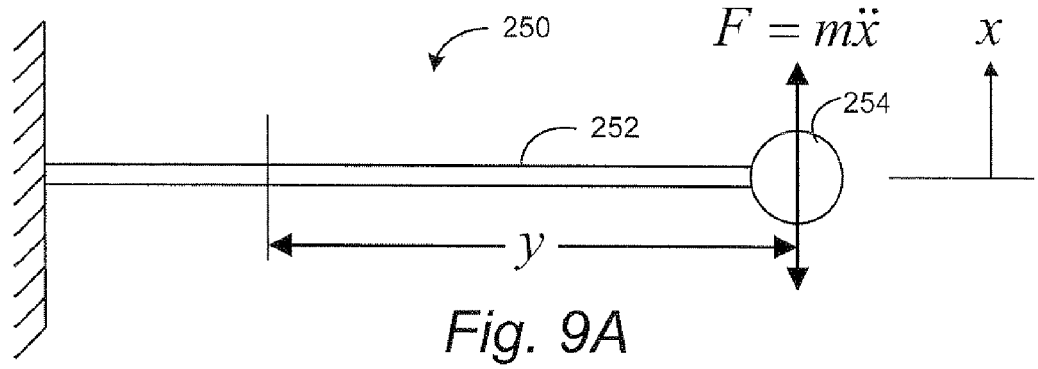
FIG. 9A and FIG. 9B are top views of the example embodiments of constant stress tapered cantilever piezoelectric beams of FIG. 8A and FIG. 8B, respectively, with a force diagram superimposed.
Figure 9B:
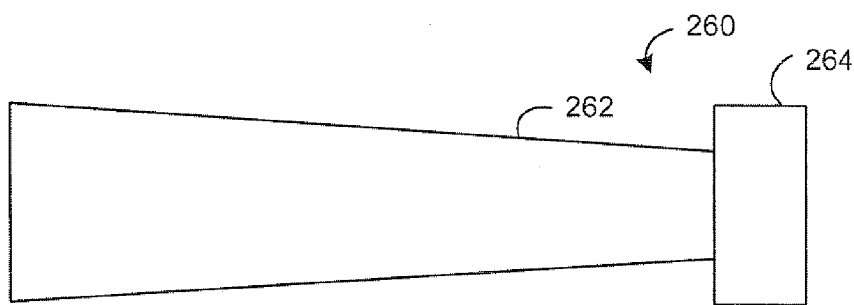

FIG. 8A and FIG. 8B show example embodiments of constant stress profiled cantilever piezoelectric beams. FIG. 9A and FIG. 9B again show the example embodiments of constant stress profiled cantilever piezoelectric beams of FIG. 8A and FIG. 8B, respectively, with a force diagram superimposed. The constant stress profiled cantilever piezoelectric beam 250 of FIG. 8A and FIG. 9A has an beam section 252 of essentially constant width, and a spherical distal mass 252. The constant stress profiled cantilever piezoelectric beam 260 of FIG. 8B and FIG. 9B has a tapered width section 262 and a solid rectangular distal mass 264. The constant stress profiled cantilever piezoelectric beam 260 of FIG. 8B is also known as a constant stress tapered cantilever piezoelectric beam.

The profiled beams of FIG. 8A and FIG. 8B are configured such that the stress in the ceramic is constant along the length. These example types of profiled beams can be more efficient since power is being produced by all of the piezoceramic.

The advantage of using a constant stress beam in piezoelectric energy harvesting application is that most of the piezoceramic material is strained and thus contributes to the power output from the device. This is not the case in a simple cantilever device where the majority of the power output from the device is generated by the piezoceramic material near the fixed end.

To design a constant stress beam, one looks at the equation that describes stress in a beam. The maximum stress in a beam is described by Equation 5.

Equation 5:
$$\sigma = \frac{M}{S}$$

In Equation 5, M=Fy is moment present at the position along the length of the beam in question, y is the distance from the point of application of the load (the end of the beam in this case) to the position in question, Equation 6 describes the section modulus, b is the beam width, and h is the thickness of the beam.

Equation 6:
$$S = \frac{bh^2}{6}$$

In an end loaded cantilever beam that is vibrating at a frequency ω the inertial force at the end of the beam where the mass is located is given by Equation 7.

$$F = m\ddot{x} \quad \text{Equation 7}$$

The moment applied to the beam is given by Equation 8, and can be recast as Equation 9.

$$M = Fy \quad \text{Equation 8}$$

$$M = m\ddot{x}y \quad \text{Equation 9}$$

Since the magnitude of the acceleration ẍ can be written as ω²x the moment becomes as shown in Equation 10.

$$M = m\omega^2 xy \quad \text{Equation 10}$$

Substituting into the stress equation yields Equation 11.

$$\sigma = \frac{6m\omega^2 x}{h^2}\frac{y}{b} = K\frac{y}{b} \quad \text{Equation 11}$$

Thus, for the embodiment of FIG. 8B, the beam can be designed for constant stress by varying the width b along the length of the beam in such a way that y/b remains constant at all points y along the beam.

Such constant stress profiled beams can be utilized in any of the embodiments described herein, or any other cantilever piezoelectric device including the piezoelectric devices illustrated in U.S. patent application Ser. No. 10/869,046, entitled "PIEZOELECTRIC GENERATORS AND METHODS OF OPERATING SAME", which is incorporated herein by reference in its entirety.

Figure 10:
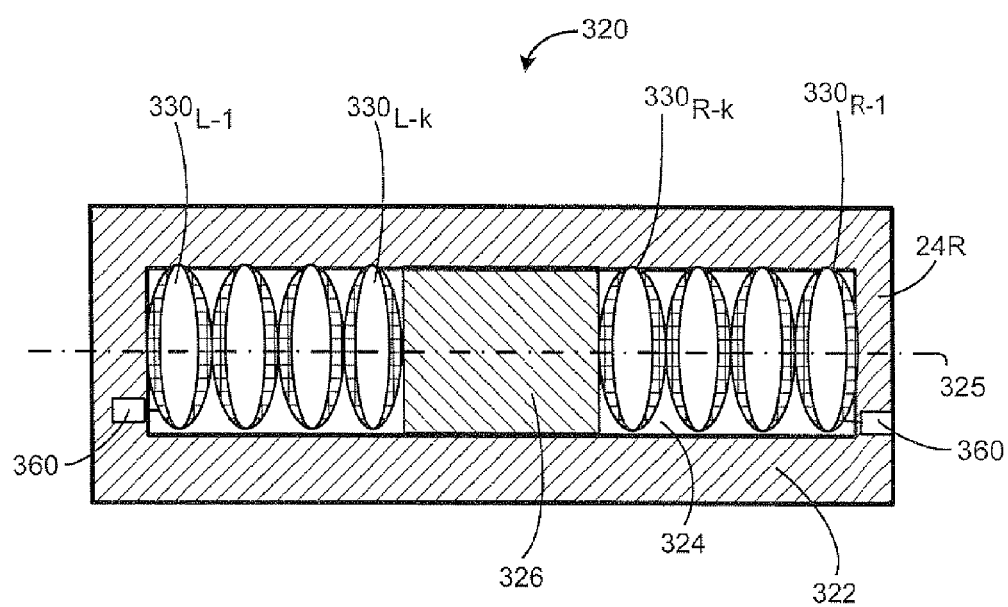
FIG. 10 is a side schematic view of a energy scavenging device according to another example embodiment.

FIG. 10 illustrates another example embodiment of a human-worn or human-borne energy scavenging device 320. The energy scavenging device 320 comprises a tubular housing 322 having a cylindrical internal chamber 324, both coaxial about axis 325. A mass member 326 is situated in the middle of chamber 324, and is surrounded on both sides (both left side and right side) by plural resilient assemblies 330. The two resilient assemblies are positioned proximate respective two ends of the chamber 324. The mass member 326 is thus situated for reciprocating motion in the chamber 324 between the two resilient assemblies 330. Each of the resilient assemblies 330 comprises two resilient assemblies each comprise a piezoelectric member which, when deflected by the mass member 326, produces a voltage and which replies to the reciprocation with a spring force to facilitate further reciprocation.

In the illustrated example embodiment, each of the resilient assemblies 330 comprises a pair of piezoelectric members, with each of the piezoelectric members comprising a concave surface and a convex surface. The two piezoelectric members have their concave surface oriented toward one another and peripheries of their concave surface substantially contacting one another. A convex surface of a first of the piezoelectric members of the pair is oriented toward the mass member 326 and a convex surface of a second of the piezoelectric members of the pair is oriented toward an end of the chamber 324.

Thus, in an example implementation, each of the resilient assemblies 330 comprises a pair of piezoelectric members arranged in a clamshell or bellows configuration. The juxtaposition or positioning of a pair of piezoelectric members in this manner is understood with reference to, e.g., U.S. patent application Ser. No. 11/024,943, filed Dec. 30, 2004, entitled "PUMPS WITH DIAPHRAGMS BONDED AS BELLOWS" which is incorporated by reference herein in its entirety.

Although in the illustrated embodiment, each side of the tubular housing 320 has four resilient assemblies 330 (e.g., k=4), it will be appreciated that a greater or lesser number (even one) bellows section may be provided on each side of mass member 326. When the energy scavenging device 320 is worn by a walking human, the vibration caused by the human gait causes mass member 326 to reciprocate in housing 322. The reciprocation of mass member 326 causes deflection of the piezoelectric members which comprise the resilient assemblies 330, thereby producing an voltage which is applied through unillustrated leads to one or more energy collection circuits 360. In addition, the flexible properties of resilient assemblies 330 reply to the reciprocation with a spring force to facilitate further reciprocation.

Although various embodiments have been shown and described in detail, the invention is not limited to any particular embodiment or example. None of the above description should be read as implying that any particular element, step, range, or function is essential such that it must be included. It is to be understood that the invention is not to be limited to the disclosed embodiment, but on the contrary, is intended to cover various modifications and equivalent arrangements.

What is claimed is:

1. Energy scavenging apparatus comprising:
    a frame which can be human-carried or human-borne;
    plural cantilevered bimorph piezoelectric members connected to the frame to have an essentially parallel orientation, each cantilevered bimorph piezoelectric member comprising a proximal end connected to the frame and a distal end;
    a mass member connected to the distal end of the plural cantilevered bimorph piezoelectric members.

2. The apparatus of claim 1, wherein the mass member is commonly connected to each of the plural cantilevered bimorph piezoelectric members.

3. The apparatus of claim 2, wherein the plural cantilevered bimorph piezoelectric members are connected to opposing sides of the frame in rib fashion, and wherein the distal end of each of the plural cantilevered bimorph piezoelectric members is connected to a sternum-situated central mass member.

4. The apparatus of claim 3, wherein the central mass member is free-floating except for its suspension attachment to the distal ends of the cantilevered bimorph piezoelectric members.

5. The apparatus of claim 3, wherein the central mass member has a mass chosen so that the resonant frequency of the apparatus is be tuned to footfall cadence.

6. The apparatus of claim 1, wherein each of the cantilevered bimorph piezoelectric members are ruggedized laminated piezoelectric devices.

7. The apparatus of claim 1, wherein each of the plural cantilevered bimorph piezoelectric members has a distinct mass member connected to its distal end.

8. The apparatus of claim 7, wherein the plural cantilevered bimorph piezoelectric members are connected to opposed sides of the frame in an interleaved fashion.

9. The apparatus of claim 7, wherein the mass member of each of the plural cantilevered bimorph piezoelectric members has a mass chosen to tune each of the plural cantilevered bimorph piezoelectric members to a desired resonant frequency to achieve a desired deflection of the distal end of the cantilevered bimorph piezoelectric member.

10. The apparatus of claim 1, wherein the frame is a bouncing body frame which is resiliently mounted to an outer frame.

11. The apparatus of claim 10, wherein the bouncing body frame comprises two opposed members to which the plural cantilevered bimorph piezoelectric members are connected, wherein each of the two opposed members has a guide channel formed therein, each guide channel being configured to slidably accommodate a guide rod connected to the outer frame, and wherein a resilient member is positioned about each guide rod between the bouncing body frame and the outer frame.

12. The apparatus of claim 10, wherein the mass member is commonly connected to each of the plural cantilevered bimorph piezoelectric members.

13. The apparatus of claim 10, wherein each of the plural cantilevered bimorph piezoelectric members has a distinct mass member connected to its distal end.

14. The apparatus of claim 13, wherein the distinct mass members are selected to scavenge energy from an input that comprises multiple frequencies.

15. The apparatus of claim 7, wherein the plural cantilevered bimorph piezoelectric members are connected to opposed sides of the frame in an interleaved fashion.

16. The apparatus of claim 1, wherein the frame is configured to be carried or borne in a manner to excite plural vibrational modes of the plural cantilevered bimorph piezoelectric members.

17. The apparatus of claim 1, wherein the frame forms part of a human-carryable backpack frame or is carried by a human-carryable backpack.

18. The apparatus of claim 1, wherein at least one of the plural cantilevered bimorph piezoelectric members comprises a non-uniform piezoelectric profile along its length.

19. The apparatus of claim 18, wherein the at least one of the plural cantilevered bimorph piezoelectric member is piezoelectrically inactive in a region near its proximal end and piezoelectrically active in region near its distal end.

20. The apparatus of claim 17, wherein the at least one of the plural cantilevered bimorph piezoelectric member is piezoelectrically active in a region near its proximal end and piezoelectrically active in region near its distal end, but is piezoelectrically inactive in a mid-section region between the region near its proximal end and the region near its distal end.

21. The apparatus of claim 1, wherein at least one of the plural cantilevered bimorph piezoelectric members comprises a constant stress profile along its length.

22. The apparatus of claim 21, wherein the at least one of the plural cantilevered bimorph piezoelectric members is tapered along at least one of its dimensions.

23. Energy scavenging apparatus comprising:
a frame which can be human-carried or human-borne;
plural piezoelectric members connected to the frame in a manner to cause vibration of the piezoelectric members as a result of human footfall and to generate output power;
an amplifier for amplifying the vibration of the piezoelectric members.

24. The apparatus of claim 23, wherein the amplifier comprises a bouncing body frame which is resiliently mounted to an outer frame.

25. The apparatus of claim 24, wherein the bouncing body frame comprises two opposed members to which the plural piezoelectric members are connected, wherein each of the two opposed members has a guide channel formed therein, each guide channel being configured to slidably accommodate a guide rod connected to the outer frame, and wherein a resilient member is positioned about each guide rod between the bouncing body frame and the outer frame.

26. An energy scavenging apparatus comprising:
a housing for defining a chamber;
two resilient assemblies positioned proximate respective two ends of the chamber;
a mass member situated for reciprocating motion in the chamber between the two resilient assemblies;
wherein each of the two resilient assemblies comprise a piezoelectric member which, when deflected by the mass member, produces a voltage and which replies to the reciprocation with a spring force to facilitate further reciprocation.

27. The apparatus of claim 26, wherein each of the two resilient assemblies comprise a pair of curved piezoelectric members, each of the piezoelectric members comprising a concave surface and a convex surface, the two piezoelectric members having their concave surface oriented toward one another and peripheries of their concave surface substantially contacting one another, and wherein a convex surface of a first of the piezoelectric members of the pair is oriented toward the mass member and a convex surface of a second of the piezoelectric members of the pair is oriented toward an end of the chamber.

* * * * *